(12) United States Patent
Nishiura et al.

(10) Patent No.: US 7,713,844 B2
(45) Date of Patent: May 11, 2010

(54) NITRIDE SEMICONDUCTOR SUBSTRATE, AND METHOD FOR WORKING NITRIDE SEMICONDUCTOR SUBSTRATE

(75) Inventors: Takayuki Nishiura, Itami (JP); Yoshio Mezaki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 759 days.

(21) Appl. No.: 11/516,518

(22) Filed: Sep. 7, 2006

(65) Prior Publication Data

US 2007/0080366 A1    Apr. 12, 2007

(30) Foreign Application Priority Data

Sep. 7, 2005    (JP) .......................... P2005-259607

(51) Int. Cl.
*H01L 21/00*    (2006.01)
(52) U.S. Cl. .............................. 438/462; 257/E21.237; 257/E21.483; 257/E21.214
(58) Field of Classification Search ................. 438/460, 438/462; 257/E21.237, E21.483, E21.214
See application file for complete search history.

(56) References Cited

U.S. PATENT DOCUMENTS

| 2003/0129809 | A1 | 7/2003 | Takyu et al. | |
|---|---|---|---|---|
| 2003/0145783 | A1 | 8/2003 | Motoki et al. | |
| 2003/0157376 | A1* | 8/2003 | Vaudo et al. | 428/698 |
| 2004/0242001 | A1 | 12/2004 | Toba et al. | |
| 2005/0141577 | A1* | 6/2005 | Ueta et al. | 372/43 |
| 2005/0224783 | A1* | 10/2005 | Matsuyama et al. | 257/14 |

FOREIGN PATENT DOCUMENTS

| EP | 0 665 576 A2 | 1/1995 |
|---|---|---|
| EP | 1 304 749 A1 | 4/2003 |
| EP | 1 437 762 A1 | 7/2004 |
| JP | 61-272636 | 12/1986 |
| JP | 2-291146 | 11/1990 |
| JP | 7-307316 | 11/1995 |
| JP | 2000-12900 | 1/2000 |
| JP | 2002-222746 | 8/2002 |
| JP | 2003-183100 | 7/2003 |
| JP | 2004-327681 | 11/2004 |
| JP | 2004-335645 | 11/2004 |

OTHER PUBLICATIONS

Chinese Office Action issued in Chinese Patent Application No. 200610114883.4, dated Jan. 9, 2009.
European Office Action, issued in corresponding European Patent Application No. 06 017 375.4-2203, dated on Aug. 29, 2007.
European Search Report issued in corresponding European Patent Application No. EP 06017375.4-2203 dated Feb. 21, 2007.

* cited by examiner

*Primary Examiner*—Davienne Monbleau
*Assistant Examiner*—Matthew Reames
(74) *Attorney, Agent, or Firm*—McDermott Will & Emery LLP

(57) ABSTRACT

A method for working a nitride semiconductor substrate, comprising the steps of: preparing a disk-shaped nitride semiconductor substrate comprising a plurality of striped regions having defect concentration regions in which crystal defect density is higher than in surrounding low defect regions; and forming a cut-out at a specific location along the edge of the nitride semiconductor substrate, using as a reference the direction in which at least one from among the plurality of striped regions extends.

5 Claims, 6 Drawing Sheets

NITRIDE SEMICONDUCTOR SUBSTRATE, AND METHOD FOR WORKING NITRIDE SEMICONDUCTOR SUBSTRATE

BACKGROUND OF THE INVENTION

1. Field of the Invention

The present invention relates to a nitride semiconductor substrate and to a method for working a nitride semiconductor substrate.

2. Related Background Art

Various kinds of gallium nitride substrate (GaN substrate) have been known in the past (see Japanese Laid-Open Patent Applications 2003-183100, 2004-335645, and 2000-12900). Japanese Laid-Open Patent Application 2004-335645 discusses a gallium nitride wafer having an orientation flat (OF) as a mark indicating crystal orientation. This orientation flat is formed by first confirming the crystal orientation by X-ray diffraction, and then grinding the wafer.

Japanese Laid-Open Patent Application H7-307316 discusses a method for forming an orientation flat on a wafer composed of a semiconductor compound other than GaN, such as GaAs, GaP, or InP. Japanese Laid-Open Patent Application H2-291146 discusses a method for detecting the position of an orientation flat formed on a wafer.

SUMMARY OF THE INVENTION

However, an orientation flat on a gallium nitride substrate is not always positioned accurately enough, and there is a need for greater positional accuracy.

The present invention was conceived in light of this situation, and it is an object thereof to provide a nitride semiconductor substrate and a method for working a nitride semiconductor substrate, with which the position of a mark indicating crystal orientation can be determined very accurately.

To solve the above problems, the method of the present invention for working a nitride semiconductor substrate comprises the steps of preparing a disk-shaped nitride semiconductor substrate comprising a plurality of striped regions having defect concentration regions in which the crystal defect density is higher than in the surrounding low defect regions, and forming a cut-out at a specific location along the edge of the nitride semiconductor substrate, using as a reference the direction in which at least one from among the plurality of striped regions extends.

Also, it is preferable that the cut-out is an orientation flat.

It is also preferable that the orientation flat is formed using a dicing saw.

It is also preferable that the cut-out is a notch.

It is also preferable that the step of forming the cut-out comprises the steps of determining the straight line that passes through the center of the nitride semiconductor substrate and lies in the direction in which at least one from among the plurality of striped regions extends, by observing the nitride semiconductor substrate with a microscope, and rotating the nitride semiconductor substrate by a specific angle around the center of the nitride semiconductor substrate, using the straight line as a reference.

It is also preferable that, in the step of determining the straight line, the nitride semiconductor substrate is irradiated with ultraviolet rays.

The nitride semiconductor substrate of the present invention is a nitride semiconductor substrate having an arc-shaped edge, comprising a plurality of striped regions having defect concentration regions in which the crystal defect density is higher than in the surrounding low defect regions, and an orientation flat that is provided on the edge of the nitride semiconductor substrate and extends substantially at a right angle to the direction in which at least one from among the plurality of striped regions extends.

It is also preferable that the orientation flat is provided at a cleavage plane.

The nitride semiconductor substrate of the present invention is a nitride semiconductor substrate having a arc-shaped edge, comprising a plurality of striped regions having defect concentration regions in which the crystal defect density is higher than in the surrounding low defect regions, and a notch that is provided on the edge of the nitride semiconductor substrate, wherein the notch is located on the straight line that passes through the center of the nitride semiconductor substrate and lies in the direction in which at least one from among the plurality of striped regions extends.

DESCRIPTION OF THE PREFERRED EMBODIMENTS

Embodiments of the present invention will now be described in detail through reference to the appended drawings. In the description of the drawings, those elements that are the same or equivalent are numbered the same, and will not be described more than once.

Figure 1:
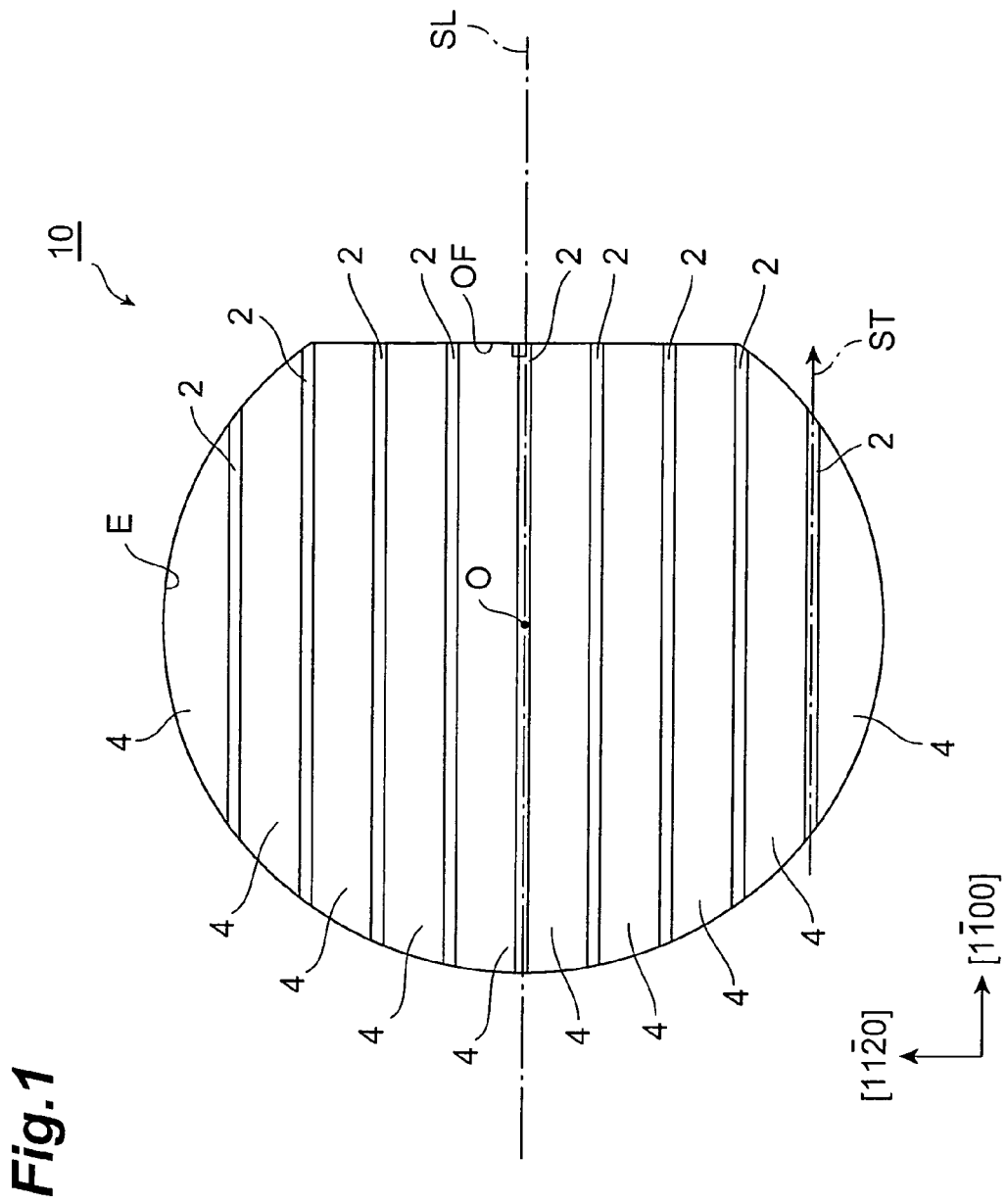
FIG. 1 is a plan view schematically illustrating the nitride semiconductor substrate in an embodiment.

FIG. 1 is a plan view schematically illustrating the nitride semiconductor substrate in an embodiment. The nitride semiconductor substrate 10 shown in FIG. 1 has an arc-shaped edge E. The nitride semiconductor substrate 10 is a gallium nitride wafer, for example. The nitride semiconductor substrate 10 can be used favorably in a semiconductor laser, LED, or other such semiconductor optical device, for example.

The nitride semiconductor substrate 10 comprises a plurality of striped regions 2, and a plurality of single crystal regions 4 that are separated by the striped regions 2. The striped regions 2 are comprised of defect concentration regions in which the crystal defect density (dislocation density) is higher than that of the surrounding single crystal regions 4 (low defect regions). Thus, the crystal defect density of the striped regions 2 is higher than the crystal defect density of the single crystal regions 4. Also, the crystal orientation of the striped regions 2 is different from the crystal orientation of the single crystal regions 4.

An orientation flat OF (cut-out) that extends substantially at a right angle to the direction ST in which one or more of the striped regions 2 extend is provided along the edge of the nitride semiconductor substrate 10. Therefore, the straight line SL that passes through the center O of the nitride semiconductor substrate 10 in the direction ST is substantially perpendicular to the orientation flat OF. An advantage to the nitride semiconductor substrate 10 having this orientation flat OF, as compared to a nitride semiconductor substrate having an orientation flat that extends parallel to the striped regions, is that mechanical positioning of the orientation flat is easier. Also, when the nitride semiconductor substrate 10 is a transparent substrate such as a GaN substrate, the manufacturing process can be automated more easily.

The orientation flat OF is an example of a cut-out that serves as a mark indicating the crystal orientation. The orientation flat OF serves as a guide in the process of manufacturing a semiconductor laser from the nitride semiconductor substrate 10, for example. This facilitates the automated transport, automated alignment, and so forth of the nitride semiconductor substrate 10.

The direction ST in which the striped regions 2 extend lies in the <1-100> direction or <11-20> direction of the single crystal regions 4. The <1-100> direction expresses a crystal orientation that is equivalent to the [1-100] direction and so forth of the single crystal regions 4. The <11-20> direction expresses a crystal orientation that is equivalent to the [11-20] direction and so forth of the single crystal regions 4.

When the direction ST lies in the <1-100> direction of the single crystal regions 4, the orientation flat OF extends in the <11-20> direction of the single crystal regions 4. When the direction ST lies in the <11-20> direction of the single crystal regions 4, the orientation flat OF extends in the <1-100> direction of the single crystal regions 4.

A nitride semiconductor substrate is obtained, for instance, by forming a mask having a window over a GaAs substrate, epitaxially growing a nitride semiconductor over this mask, and then removing the GaAs substrate. With the nitride semiconductor substrate 10, for example, the direction ST in which the striped regions 2 extend and the [11-20] direction of the single crystal regions 4 can be made to match up with high accuracy by using a stripe mask that extends in the [−110] direction of the GaAs substrate to form the nitride semiconductor substrate 10.

Thus, with the nitride semiconductor substrate 10, the direction ST in which the striped regions 2 extend can be made to match the desired crystal orientation with high accuracy. Therefore, the location of the orientation flat OF can be determined with high accuracy by using the direction ST as a reference. For instance, when the direction ST matches the [1-100] direction with high accuracy, the orientation flat OF and the [11-20] direction of the single crystal regions 4 can be made to match with high accuracy.

As a result, even in the manufacture of a semiconductor laser with stringent positioning accuracy requirements, such as no more than 0.02 degree, the semiconductor laser can be manufactured favorably by using the nitride semiconductor substrate 10. In this case, the error in forming the striped regions 2 (such as the angle formed by the direction ST and the [1-100] direction) is preferably no more than 0.01 degree, and the error in working the orientation flat OF (the angle formed by the orientation flat OF and the direction obtained by rotating the direction ST 90 degrees) is preferably no more than 0.01 degree. This allows the angle formed by the orientation flat OF and the [11-20] direction of the single crystal regions 4 to be no more than 0.02 degree. Also, if the error in forming the striped regions 2 is no more than 0.03 degree, and the error in working the orientation flat OF is no more than 0.01 degree, the angle formed by the orientation flat OF and the [11-20] direction of the single crystal regions 4 can be kept to no more than 0.04 degree.

Also, it is preferable if the orientation flat OF is provided at a cleavage plane. In this case, it is easier to cut the nitride semiconductor substrate in the formation of the orientation flat OF, so the orientation flat OF can be formed more accurately. Also, a semiconductor laser or other such semiconductor optical device can be favorably manufactured. When the nitride semiconductor substrate 10 is comprised of gallium nitride, for example, the [1-100] direction of the single crystal regions 4 is the normal direction of the cleavage plane.

Also, when the nitride semiconductor substrate 10 is a two-inch wafer, the length of the orientation flat OF is preferably 16±1 mm.

Furthermore, the orientation flat OF may be chamfered as necessary. For instance, it is preferable for the orientation flat OF to be round chamfered at a radius of 0.1 to 0.25 mm. When this is done, chipping is less likely to occur during transport of the nitride semiconductor substrate 10. Also, the orientation flat OF may be round chamfered at a radius of 2 μm. Since the amount of chamfering is small in this case, the optical positioning accuracy of the nitride semiconductor substrate 10 is enhanced.

The edge E (the edge where the orientation flat OF is not formed) of the nitride semiconductor substrate 10 has substantially no effect on the optical positioning accuracy of the nitride semiconductor substrate 10. Thus, it is preferable for the edge E of the nitride semiconductor substrate 10 to be round chamfered at a radius of 0.1 to 0.25 mm.

The striped regions 2 need not consist entirely of the defect concentration regions. For instance, defect concentration regions and single crystal regions (low defect regions) may be alternated repeatedly in the direction ST within the striped regions 2.

Also, the nitride semiconductor substrate 10 may be comprised of a III-nitride semiconductor other than gallium nitride, such as aluminum nitride or indium nitride. Furthermore, an index flat (IF) that is shorter in length than the orientation flat OF may be provided to the edge E of the nitride semiconductor substrate 10. When the nitride semiconductor substrate 10 is a two-inch wafer, the length of the IF is preferably 7±1 mm.

Also, the direction ST in which the striped regions 2 extend may be matched to the [11-20] direction of the single crystal regions 4 with high accuracy. In this case, the orientation flat OF and the [1-100] direction of the single crystal regions 4 can be matched with high accuracy.

Figure 2:
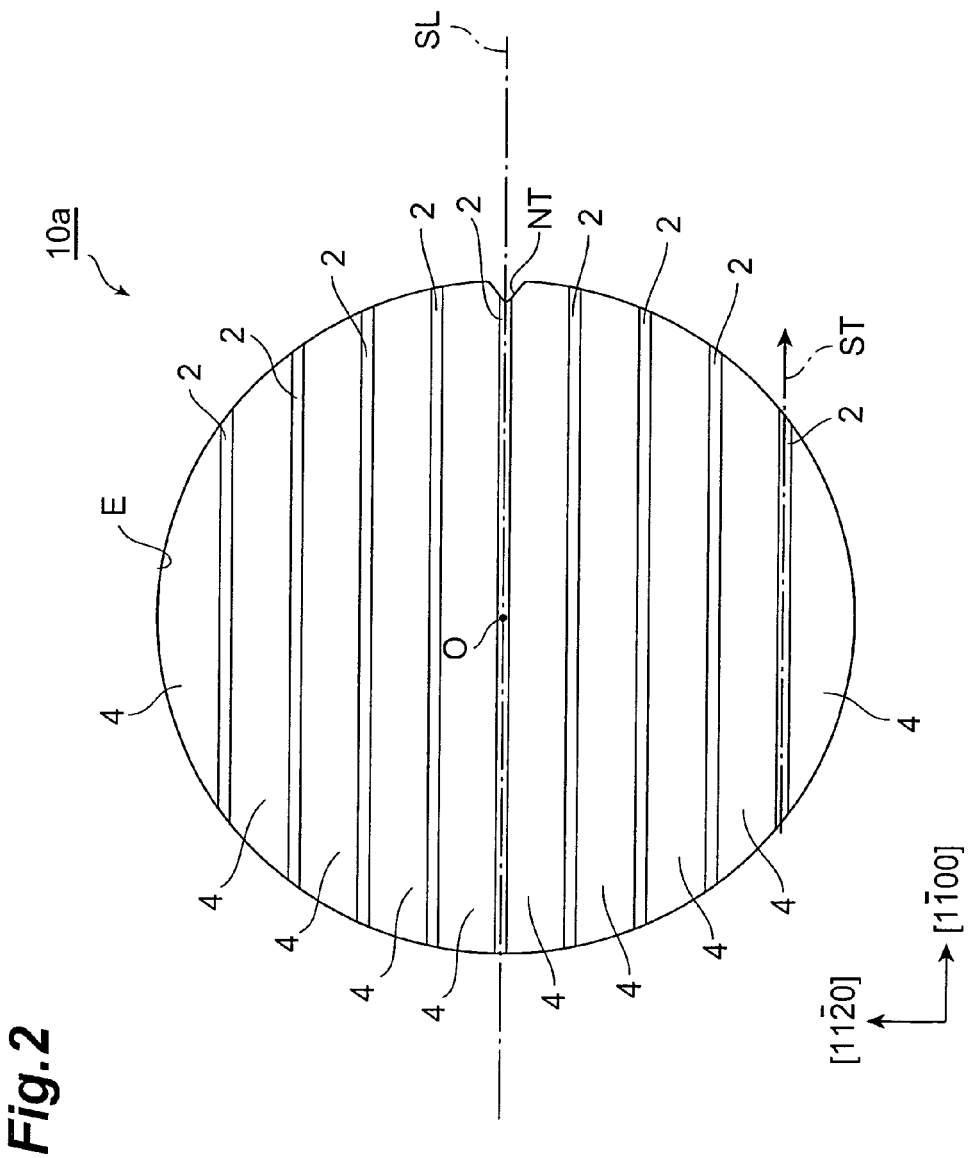
FIG. 2 is a plan view schematically illustrating the nitride semiconductor substrate in another embodiment.

FIG. 2 is a plan view schematically illustrating the nitride semiconductor substrate in another embodiment. The nitride semiconductor substrate 10a shown in FIG. 2 has an arc-shaped edge E. The nitride semiconductor substrate 10a comprises striped regions 2 and single crystal regions 4. A notch NT (cut-out) is provided to the edge of the nitride semiconductor substrate 10a.

The notch NT is located on the straight line SL that passes through the center O of the nitride semiconductor substrate 10a in the direction ST in which the striped regions 2 extend. This notch NT entails the removal of less material than the orientation flat OF. As a result, more semiconductor devices can be obtained from the nitride semiconductor substrate 10a, and the material yield is also higher.

Just as with the nitride semiconductor substrate 10, the direction ST and the desired crystal orientation can be matched with high accuracy with the nitride semiconductor substrate 10a as well. Therefore, with the nitride semiconductor substrate 10a, the location of the notch NT can be determined with high accuracy.

Figure 3:
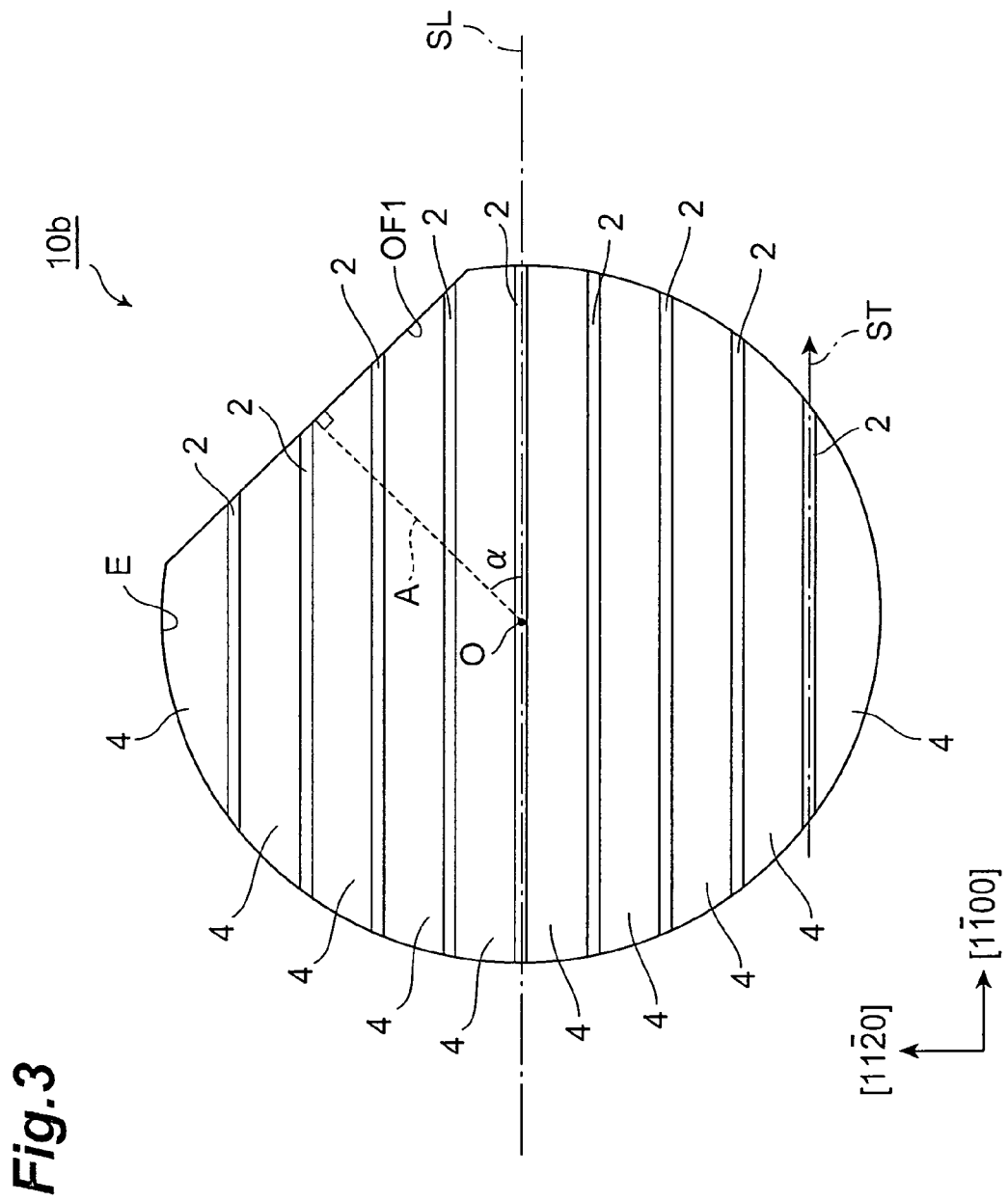
FIG. 3 is a plan view schematically illustrating a nitride semiconductor substrate.

FIG. 3 is a plan view schematically illustrating a nitride semiconductor substrate. The nitride semiconductor substrate 10b shown in FIG. 3 has an arc-shaped edge E. The nitride semiconductor substrate 10b comprises striped regions 2 and single crystal regions 4. An orientation flat OF1

(cut-out) is provided to the edge of the nitride semiconductor substrate 10*b*. The orientation flat OF1 extends substantially at a right angle to a straight line A obtained by rotating the straight line SL by a specific angle α about the center O of the nitride semiconductor substrate 10*b*. The specific angle α is preferably at least +10 degrees and no more than +80 degrees, and at least −10 degrees and no more than −80 degrees. In this case, the front and back of the nitride semiconductor substrate 10*b* can be identified even without forming an IF. The specific angle α is 45 degrees, for instance.

Figure 4:
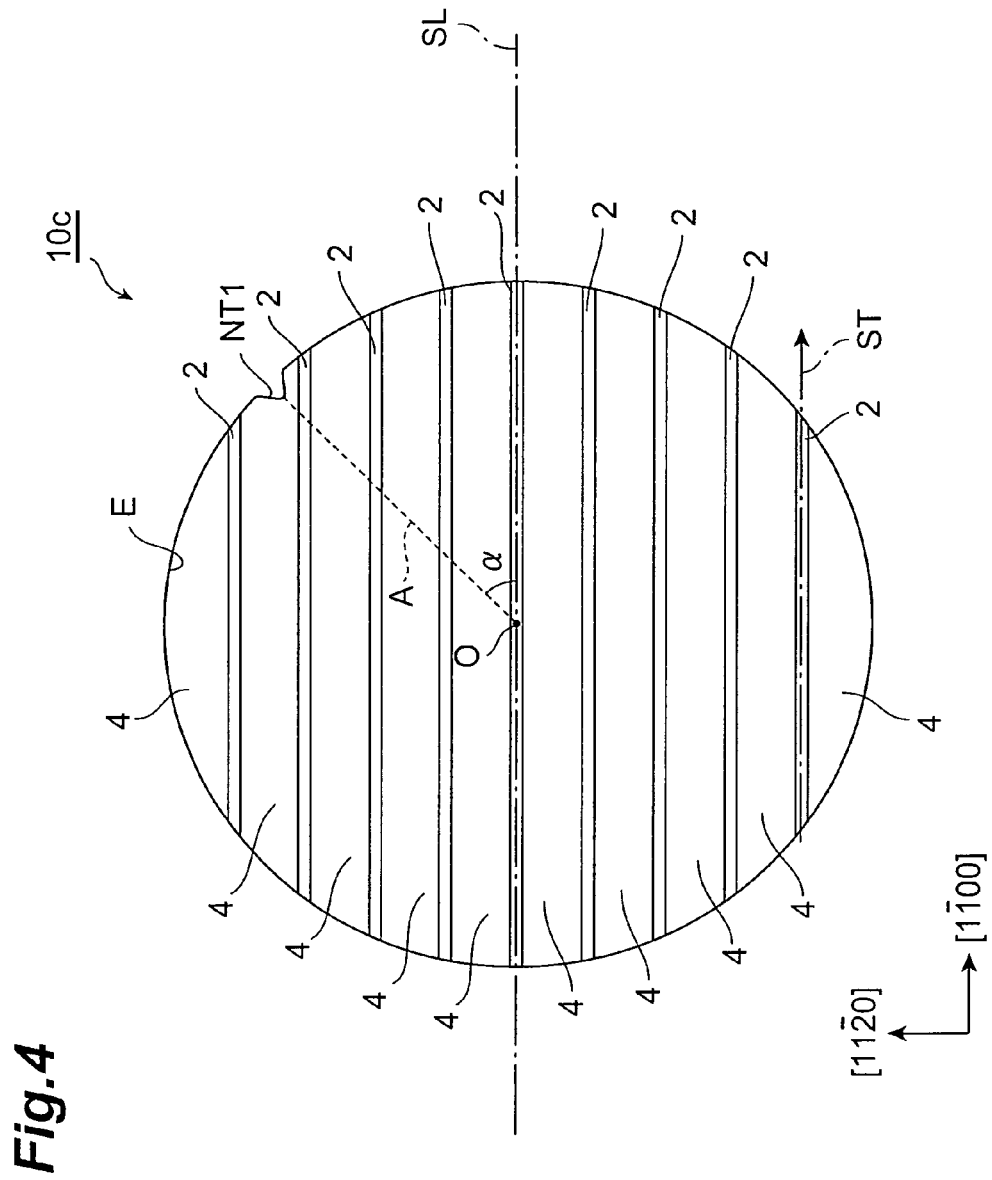
FIG. 4 is a plan view schematically illustrating a nitride semiconductor substrate.

FIG. 4 is a plan view schematically illustrating a nitride semiconductor substrate. The nitride semiconductor substrate 10*c* shown in FIG. 4 has an arc-shaped edge E. The nitride semiconductor substrate 10*c* comprises striped regions 2, single crystal regions 4, and a notch NT1 (cut-out) provided to the edge of the nitride semiconductor substrate 10*c*. The notch NT1 is located on the straight line A, allowing the front and back of the nitride semiconductor substrate 10*c* to be identified.

Figure 5:
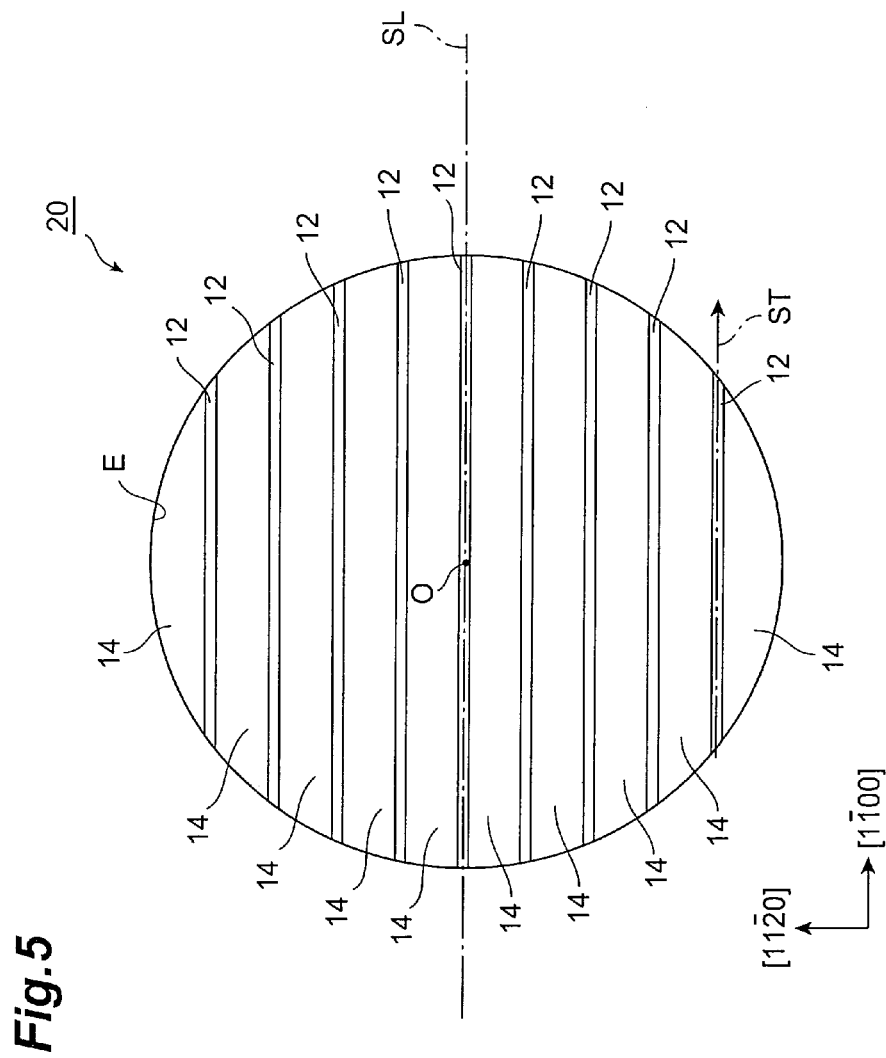
FIG. 5 is a plan view schematically illustrating a step in the method for working a nitride semiconductor substrate pertaining to an embodiment.
Figure 6:
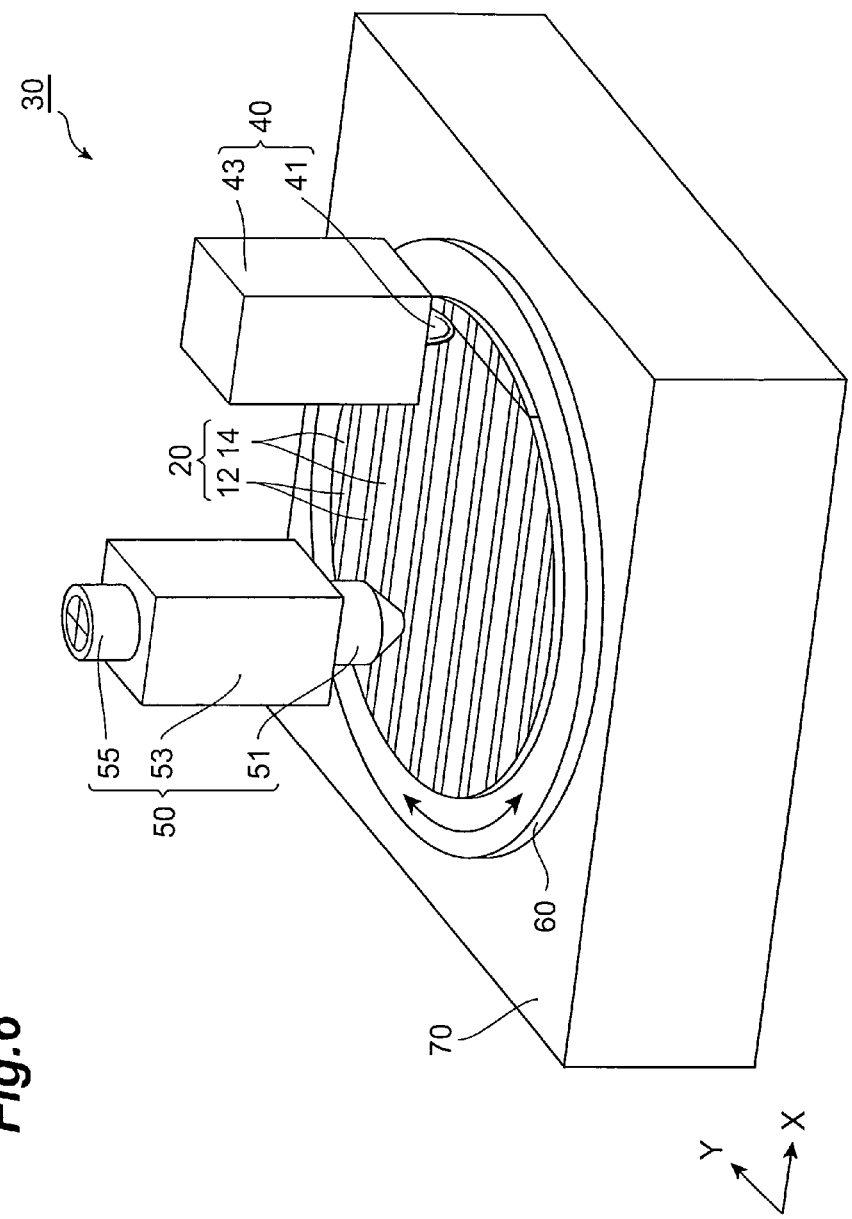
FIG. 6 is a perspective view schematically illustrating an apparatus for working a nitride semiconductor substrate.

Next, the method for working a nitride semiconductor substrate pertaining to this embodiment will be described through reference to FIGS. 1, 5, and 6. FIG. 5 is a plan view schematically illustrating a step in the method for working a nitride semiconductor substrate pertaining to an embodiment. FIG. 6 is a perspective view schematically illustrating an apparatus for working a nitride semiconductor substrate.

(Substrate Preparation Step)

First, as shown in FIG. 5, a disk-shaped nitride semiconductor substrate 20 is readied, which comprises a plurality of striped regions 12 comprised of defect concentration regions in which the crystal defect density is higher than in the surrounding low defect regions 14 (low defect regions). The single crystal regions 14 are separated by the striped regions 12. The defect concentration regions and single crystal regions (low defect regions) may be disposed in an alternating pattern in the direction ST within the striped regions 12.

(Cut-out Formation Step)

Next, as shown in FIGS. 1 to 5, the orientation flat OF is formed as a cut-out at a specific location along the edge of the nitride semiconductor substrate 20, using as a reference the direction ST in which one or more of the plurality of striped regions 12 extend. Consequently, the striped regions 2 are formed from the striped regions 12, and the single crystal regions 4 are formed from the single crystal regions 14. As a result, the nitride semiconductor substrate 10 is obtained from the nitride semiconductor substrate 20.

The orientation flat OF is formed, for example, by grinding, laser working, discharge working, ultrasonic working, or the like. The orientation flat OF may be formed by cleavage, although the material cost will be higher. Also, etching or polishing may be performed after the orientation flat OF is formed.

The orientation flat OF is favorably formed by using the working apparatus 30 shown in FIG. 6, for example. The working apparatus 30 comprises a drive mechanism 70 capable of driving in the X and Y axes (horizontal directions), and a stage 60 that is provided on the drive mechanism 70 and is used to hold the nitride semiconductor substrate 20. For example, the nitride semiconductor substrate 20 can be moved in the X axis direction or the Y axis direction by moving the drive mechanism 70 in the X axis direction or the Y axis direction. Also, the nitride semiconductor substrate 20 can be rotated by rotating the stage 60.

The working apparatus 30 also preferably comprises a microscope 50 for observing the surface of the nitride semiconductor substrate 20, and a dicing saw 40 for forming the orientation flat OF. Using the microscope 50 allows the orientation flat OF to be formed more easily and less expensively. Using the dicing saw 40 allows the orientation flat OF to be formed more simply. The cost can be also be lowered by using a commercially available dicing saw. In forming the orientation flat OF, either the nitride semiconductor substrate 20 may be moved, or the dicing saw 40 may be moved.

The orientation flat OF may be formed using a grinder, a laser light source for laser working, an electrode for discharge working, a tool for ultrasonic working, or the like instead of the dicing saw 40. When a grinder is used, a cylindrical grindstone, a grindstone having a shape corresponding to a chamfered shape, a peripheral cutting edge grindstone, or the like can be used favorably, for example.

The microscope 50 preferably comprises an objective lens 51 disposed opposite the surface of the nitride semiconductor substrate 20, an optical system 53 that receives light from the objective lens 51, and a display component 55 receiving light from the optical system 53 and capable of displaying the surface condition of the nitride semiconductor substrate 20. Axial alignment is preferably performed ahead of time so that the X and Y axes of the microscope 50 will be aligned with the X and Y axes of the drive mechanism 70. The dicing saw 40 preferably comprises a diamond blade 41 for cutting the nitride semiconductor substrate 20, and a drive component 43 for driving the diamond blade 41.

The working apparatus 30 may also have a working apparatus (not shown) for working the end faces of the nitride semiconductor substrate 20. This apparatus can be used to chamfer the orientation flat OF.

The cut-out formation step will now be described in more detail. The cut-out formation step preferably includes the following observation step and rotation step. First, in the observation step, the nitride semiconductor substrate 20 is observed with the microscope 50. This is done to determine the straight line SL in the direction ST in which the striped regions 12 extend. A white light source, green light source, violet light source, or the like can be used as the light source for the microscope 50. The use of a green light source makes it easier to clearly distinguish between the single crystal regions 14 and the striped regions 12.

It is also preferable to irradiate the nitride semiconductor substrate 20 with ultraviolet rays. In this case, since the constituent material of the nitride semiconductor substrate 20 emits fluorescent light, the single crystal regions 14 can be clearly distinguished from the striped regions 12, allowing the straight line SL to be determined more easily and accurately.

Next, in the rotation step, the nitride semiconductor substrate 20 is rotated a specific angle around the center O of the nitride semiconductor substrate 20, using the straight line SL as a reference. This allows the nitride semiconductor substrate 20 to be adjusted to the desired position. As a result, the position of the orientation flat OF can be determined with greater accuracy. For instance, the nitride semiconductor substrate 20 is rotated such that the striped regions 12 are included in a band of ±8 μm or less in the Y axis direction from the X axis of the microscope 50. This allows the angle formed by the direction ST in which the striped regions 12 extend and the X axis of the drive mechanism 70 to be kept within 0.01 degree or less. After this, the orientation flat OF can be formed by moving the dicing saw 40 in the Y axis direction.

As discussed above, the method for working a nitride semiconductor substrate of this embodiment involves the use of the nitride semiconductor substrate 20 comprising the striped regions 12. In forming the striped regions 12, the direction ST in which the striped regions 12 extend can be matched up with the desired crystal orientation at high accuracy. Therefore, by using the direction ST as a reference, the location of the orientation flat OF can be determined at high accuracy without using X-ray diffraction.

Furthermore, in the cut-out formation step, the orientation flat OF1 (see FIG. 3) may be formed instead of the orientation flat OF by rotating the nitride semiconductor substrate 20 by a specific angle α. Also, in the cut-out formation step, the notch NT (see FIG. 2) or the notch NT1 (see FIG. 4) may be formed instead of the orientation flat OF. In either case, by using the direction ST as a reference, the location of the cut-out can be determined at high accuracy without using X-ray diffraction.

Preferred embodiments of the present invention were described above in detail, but the present invention is not limited to these embodiments.

The present invention provides a nitride semiconductor substrate and a method for working a nitride semiconductor substrate, with which the location of a mark indicating crystal orientation can be determined at high accuracy.

What is claimed is:

1. A method for working a nitride semiconductor substrate, the method comprising steps of:

preparing a disk-shaped nitride semiconductor substrate, the substrate having a center and includes a plurality of striped regions having defect concentration regions in which crystal defect density is higher than in surrounding low defect regions;

establishing a reference line by observation of the nitride semiconductor substrate through a microscope, the reference line extending through the center of the nitride semiconductor substrate in a straight line direction along one of the striped regions;

rotating the nitride semiconductor substrate by a specific angle around the center of the nitride semiconductor substrate with reference to the established reference line; and forming a cut-out at a location along an edge of the nitride semiconductor substrate.

2. The method for working a nitride semiconductor substrate according to claim 1, wherein the cut-out is an orientation flat.

3. The method for working a nitride semiconductor substrate according to claim 2, wherein the orientation flat is formed with a dicing saw.

4. The method for working a nitride semiconductor substrate according to claim 1, wherein the cut-out is a notch.

5. The method for working a nitride semiconductor substrate according to claim 1, wherein, in the step of establishing the reference line, the nitride semiconductor substrate is irradiated with ultraviolet rays.

* * * * *